United States Patent
Kim et al.

(10) Patent No.: US 11,706,998 B2
(45) Date of Patent: Jul. 18, 2023

(54) MAGNETIC TUNNEL JUNCTION AND MAGNETIC MEMORY DEVICE COMPRISING THE SAME

(71) Applicant: Samsung Electronics Co., Ltd., Suwon-si (KR)

(72) Inventors: Kwang Seok Kim, Seoul (KR); Young Man Jang, Hwaseong-si (KR); Ung Hwan Pi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 49 days.

(21) Appl. No.: 17/344,206

(22) Filed: Jun. 10, 2021

(65) Prior Publication Data

US 2021/0305497 A1    Sep. 30, 2021

Related U.S. Application Data

(63) Continuation of application No. 16/685,415, filed on Nov. 15, 2019, now Pat. No. 11,088,319.

(30) Foreign Application Priority Data

Feb. 1, 2019   (KR) .................. 10-2019-0013435

(51) Int. Cl.
*H10N 50/85*    (2023.01)
*G11C 11/16*    (2006.01)
(Continued)

(52) U.S. Cl.
CPC ........... *H10N 50/85* (2023.02); *G11C 11/161* (2013.01); *G11C 11/1659* (2013.01);
(Continued)

(58) Field of Classification Search
CPC ..... H01L 43/10; H01L 27/228; G11C 11/161; G11C 11/1659; H10N 50/85; H10N 50/80; H10B 61/22; H01F 10/3286
(Continued)

(56) References Cited

U.S. PATENT DOCUMENTS

| 8,064,159 B2 | 11/2011 | Sakamoto et al. |
| 8,675,319 B2 | 3/2014 | He et al. |

(Continued)

FOREIGN PATENT DOCUMENTS

| KR | 10-2015-0068294 A | 6/2015 |
| KR | 10-2016-0051524 A | 5/2016 |
| KR | 10-2017-0093568 A | 8/2017 |

OTHER PUBLICATIONS

Non-Final Office Action dated Jan. 25, 2021 in U.S. Appl. No. 16/685,415.
(Continued)

*Primary Examiner* — Jami Valentine Miller
(74) *Attorney, Agent, or Firm* — Harness, Dickey & Pierce, P.L.C.

(57) ABSTRACT

In one embodiment, the magnetic memory device includes a free layer structure having a variable magnetization direction. The free layer structure includes a first free layer, the first free layer being a first Heusler alloy; a coupling layer on the first free layer, the coupling layer including a metal oxide layer; and a second free layer on the metal oxide layer, the second free layer being a second Heusler alloy, the second Heusler alloy being different from the first Heusler alloy.

19 Claims, 8 Drawing Sheets

(51) Int. Cl.
  *H10B 61/00* (2023.01)
  *H10N 50/80* (2023.01)
  *H01F 10/32* (2006.01)
(52) U.S. Cl.
  CPC ............. *H10B 61/22* (2023.02); *H10N 50/80* (2023.02); *H01F 10/3286* (2013.01)
(58) Field of Classification Search
  USPC .......................................................... 257/421
  See application file for complete search history.

(56) References Cited

U.S. PATENT DOCUMENTS

| | | | |
|---|---|---|---|
| 9,007,818 B2 | 4/2015 | Sandhu et al. | |
| 9,076,467 B2 | 7/2015 | Carey et al. | |
| 9,634,241 B2 | 4/2017 | Butler et al. | |
| 9,966,529 B1 | 5/2018 | Iwata et al. | |
| 2009/0154025 A1* | 6/2009 | Carey ................. | G01R 33/098 360/314 |
| 2010/0097729 A1* | 4/2010 | Gill ........................ | B82Y 10/00 360/324 |
| 2013/0164549 A1* | 6/2013 | Nishioka ................ | B32B 15/04 427/126.1 |
| 2015/0162378 A1* | 6/2015 | Carey ..................... | H01L 43/02 257/421 |
| 2017/0141297 A1 | 5/2017 | Apalkov et al. | |
| 2017/0294574 A1 | 10/2017 | Hong et al. | |
| 2018/0069173 A1 | 3/2018 | Sonobe et al. | |
| 2018/0190899 A1 | 7/2018 | Kim et al. | |
| 2018/0366172 A1* | 12/2018 | Wang ...................... | H01L 43/08 |

OTHER PUBLICATIONS

Notice of Allowance dated Apr. 15, 2021 in U.S. Appl. No. 16/685,415.

Office Action dated Dec. 9, 2022 in Korean Application No. 10-2019-0013435.

* cited by examiner

MAGNETIC TUNNEL JUNCTION AND MAGNETIC MEMORY DEVICE COMPRISING THE SAME

This application is a Continuation of U.S. application Ser. No. 16/685,415, filed on Nov. 15, 2019, which claims priority to Korean Patent Application No. 10-2019-0013435, filed on Feb. 1, 2019, and all the benefits accruing therefrom under 35 U.S.C. § 119, the disclosure of each of which is incorporated herein by reference in its entirety.

BACKGROUND

1. Technical Field

The present inventive concepts relate to a magnetic tunnel junction and a magnetic memory device including the same.

2. Description of the Related Art

Along with higher speed and lower power consumption of electronic devices, it is desired that memory devices embedded in the electronic devices also have rapid read/write operation and low operating voltage. As such a memory device, a magnetic memory device has been studied. Since the magnetic memory device is nonvolatile and capable of operating at high speed, the magnetic memory device is attracting attention as a next generation memory.

Meanwhile, as magnetic memory elements are increasingly highly integrated, magnetic random access memory (MRAM) that stores information by utilizing a spin transfer torque (STT) phenomenon has been studied. The STT-MRAM may store information by directly applying a current to the magnetic tunnel junction to induce magnetization reversal. Highly integrated STT-MRAM desirably would have a high-speed operation and a low-current operation.

SUMMARY

At least one embodiment relates to a magnetic memory device.

In one embodiment, the magnetic memory device includes a free layer structure having a variable magnetization direction. The free layer structure includes a first free layer, the first free layer being a first Heusler alloy; a coupling layer on the first free layer, the coupling layer including a metal oxide layer; and a second free layer on the metal oxide layer, the second free layer being a second Heusler alloy, the second Heusler alloy being different from the first Heusler alloy. The magnetic memory device may further include a pinned layer structure, the pinned layer structure having a fixed magnetization direction; and a tunnel barrier layer between the pinned layer structure and the free layer structure includes a free layer structure having a variable magnetization direction. The free layer structure includes a first free layer, the first free layer being a first Heusler alloy and having a cubic structure, a metal oxide layer on the first free layer, and a second free layer on the metal oxide layer, the second free layer being a second Heusler alloy having a tetragonal structure. The magnetic memory device may further include a pinned layer structure, the pinned layer structure having a fixed magnetization direction; and a tunnel barrier layer between the pinned layer structure and the free layer structure.

In a further embodiment, the magnetic memory device, includes a pinned layer structure and a free layer structure. The pinned layer structure has a fixed magnetization direction. The pinned layer structure includes a first pinned layer, a non-magnetic layer, and a second pinned layer, the first pinned layer and the second pinned layer having antiparallel magnetization directions. The free layer structure has a variable magnetization direction. The free layer structure includes a first free layer, a metal oxide layer on the first free layer, and a second free layer on the metal oxide layer. The first free layer is a first Heusler alloy having a cubic structure and a first saturation magnetization. The second free layer is a second Heusler alloy having a tetragonal structure and having a second saturation magnetization. The second saturation magnetization is less than the first saturation magnetization, and a magnetic coupling strength between the first free layer and second free layer is 0.05-1 erg/cm2. The magnetic memory device includes a tunnel barrier layer between the pinned layer structure and the free layer structure.

In another embodiment, the magnetic memory device includes a free layer structure having a variable magnetization direction. The free layer structure includes a first free layer, the first free layer being an ordered iron alloy; a metal oxide layer on the first free layer; and a second free layer on the metal oxide layer, the second free layer being a Heusler alloy and having a tetragonal structure. The magnetic memory devices includes a pinned layer structure, the pinned layer structure having a fixed magnetization direction; and a tunnel barrier layer between the pinned layer structure and the free layer structure.

At least one embodiment relates to method of manufacturing a magnetic memory device.

In one embodiment, the method includes forming a first layer of a first material; annealing the first material to form a first free layer, the first free layer being a first Heusler alloy; forming a metal oxide layer on the first free layer; forming a second layer of material on the metal oxide; and annealing the second material to form a second free layer on the metal oxide layer, the second free layer being a second Heusler alloy, the second Heusler alloy being different from the first Heusler alloy.

In another embodiment, the method includes forming a first layer of a first material; forming a metal oxide layer on the first layer; forming a second layer of a second material on the metal oxide; and annealing the first and second materials to form a first free layer and a second free layer, respectively, the metal oxide layer between the first and second free layers, the first free layer being a first Heusler alloy, the second free layer being a second Heusler alloy, the second Heusler alloy being different from the first Heusler alloy.

In a further embodiment, the magnetic memory device includes a magnetic tunnel junction. The magnetic tunnel junction includes a pinned layer, the pinned layer having a fixed magnetization direction; a free layer having a variable magnetization direction and including an exchange coupled composite, the exchange coupled composite including first and second Heusler alloys separated by a metal oxide layer; and a tunnel barrier layer between the pinned layer and the free layer. The magnetic memory device includes a selection device electrically connected to the magnetic tunnel junction; and control logic configured to control the selection device to write data into the magnetic tunnel junction in less than or equal to 10 ns using a write current of less than 150 uA.

BRIEF DESCRIPTION OF THE DRAWINGS

The above and other aspects and features of the present inventive concepts will become more apparent by describing in detail example embodiments thereof with reference to the attached drawings, in which.

DETAILED DESCRIPTION OF THE EMBODIMENTS

Hereinafter, a magnetic tunnel junction and a magnetic memory device according to some embodiments of the present inventive concepts will be described with reference to FIGS. 1 to 12.

Figure 1:
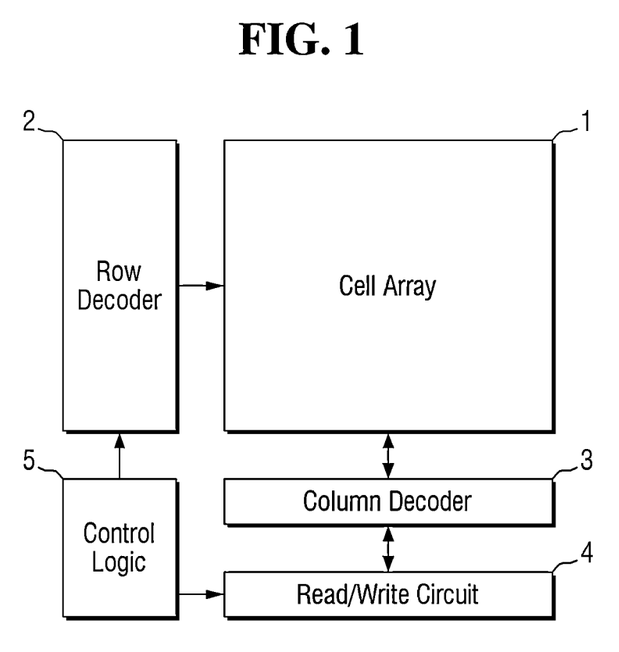
FIG. 1 is a block diagram of the magnetic memory device according to some embodiments of the present inventive concepts.

FIG. 1 is a block diagram of the magnetic memory device according to some embodiments of the present inventive concepts.

Referring to FIG. 1, the magnetic memory device includes a cell array 1, a row decoder 2, a column decoder 3, a read/write circuit 4, and a control logic 5.

The cell array 1 may include a plurality of word lines and a plurality of bit lines. Memory cells may be connected to a point at which the word line and the bit line intersect each other. The cell array 1 will be more specifically described below with reference to FIG. 2.

The row decoder 2 may be connected to the cell array 1 via the word line. The row decoder 2 may decode an address input from outside and select one of the plurality of word lines.

The column decoder 3 may be connected to the cell array 1 via the bit lines. The column decoder 3 may decode the address input from the outside and select one of the plurality of bit lines. The bit line selected by the column decoder 3 may be connected to the read/write circuit 4.

The read/write circuit 4 may provide a bit line bias for accessing the selected memory cell under the control of the control logic 5. For example, the read/write circuit 4 may provide a bit line bias to the selected bit line so as to write or read the input data to or from the memory cell.

The control logic 5 may output control signals for controlling the magnetic memory device in accordance with a command signal provided from the outside. The control signals that are output from the control logic 5 may control the read/write circuit 4.

Figure 2:
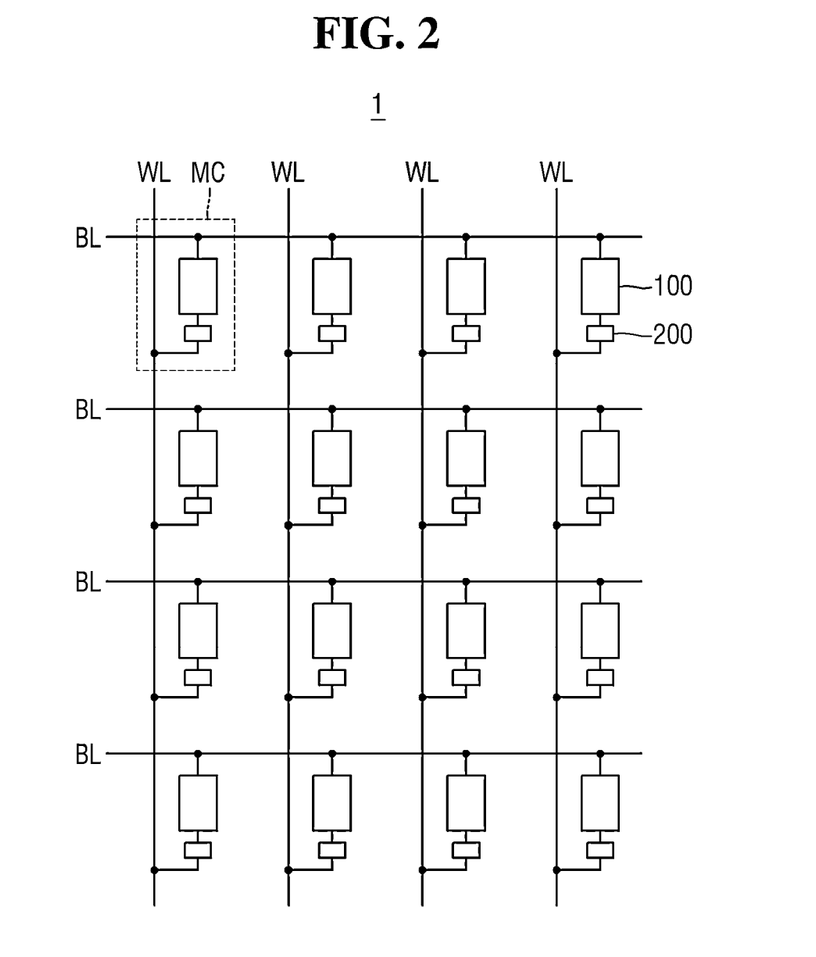
FIG. 2 is a circuit diagram of a cell array of the magnetic memory device according to some embodiments of the present inventive concepts.
Figure 3:
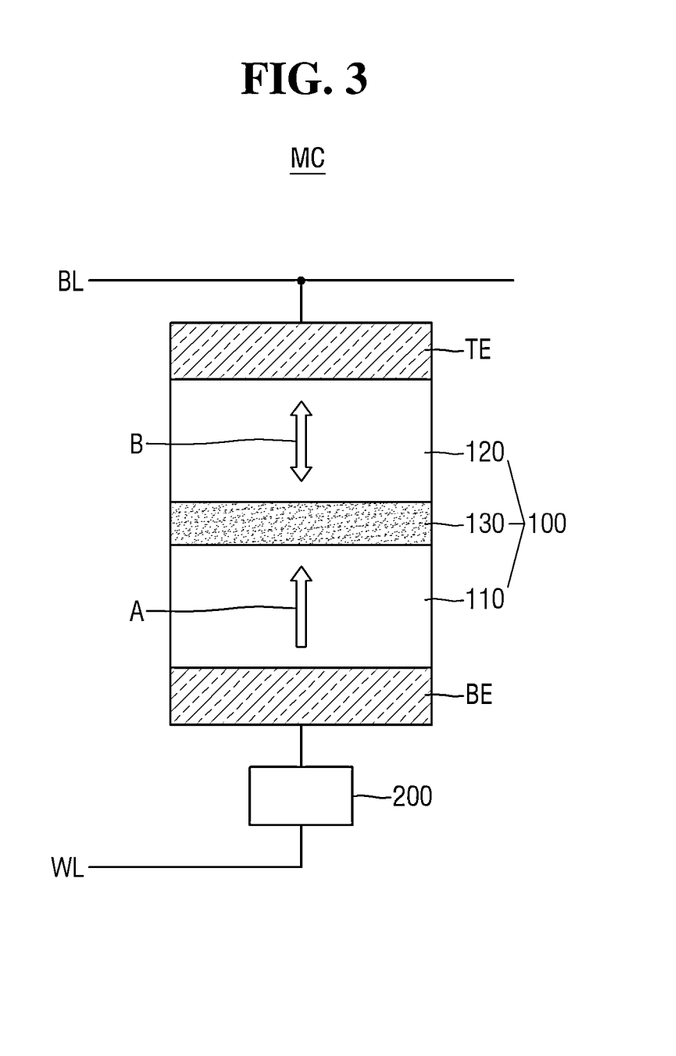
FIG. 3 is a conceptual diagram illustrating a unit memory cell of the magnetic memory device according to some embodiments of the present inventive concepts.

FIG. 2 is a circuit diagram of a cell array of the magnetic memory device according to some embodiments of the present inventive concepts. FIG. 3 is a conceptual diagram illustrating a unit memory cell of the magnetic memory device according to some embodiments of the present inventive concepts.

Referring to FIG. 2, the cell array 1 includes a plurality of bit lines BL, a plurality of word lines WL, and a plurality of unit memory cells MC.

The word lines WL may extend in a first direction, and the bit lines BL may extend in a second direction intersecting the first direction. The unit memory cells MC may be arranged two-dimensionally or three-dimensionally. Each unit memory cell MC may be connected to an intersection between the word lines WL and the bit line BL intersecting each other. As a result, each unit memory cell MC connected to the word lines WL may be connected to the read/write circuit (for example, 40 of FIG. 1) by the bit lines BL.

Referring to FIG. 3, in the magnetic memory device according to some embodiments, the unit memory cell MC includes a magnetic tunnel junction 100 and a selection element 200. For reference, FIG. 3 illustrates the magnetic memory device as a STT-MRAM.

The magnetic tunnel junction 100 may be connected between the bit line BL and the selection element 200. The selection element 200 may be connected between the magnetic tunnel junction 100 and the word line WL. The magnetic tunnel junction 100 may include a pinned layer 110, a free layer 120, and a tunnel barrier layer 130.

The pinned layer 110 may have a fixed magnetization direction. For example, the magnetization direction of the pinned layer 110 may be fixed, regardless of the program current passing through the pinned layer. The pinned layer 110 may have perpendicular magnetic anisotropy (PMA). That is, the pinned layer 110 may have a magnetization easy axis in a direction perpendicular to an extension direction of the pinned layer 110. In the pinned layer 110, a unidirectional arrow A of FIG. 3 illustrates that the magnetization direction of the pinned layer 110 is fixed vertically.

The pinned layer 110 may include a ferromagnetic substance. For example, the pinned layer 110 may include at least one of an amorphous rare earth element alloy, a multilayer thin film in which a ferromagnetic metal (FM) and a nonmagnetic metal (NM) are alternately stacked, an alloy having a L10 type crystal structure, a cobalt-based alloy, or combinations thereof. The amorphous rare earth element alloy may include, for example, alloys such as TbFe, TbCo, TbFeCo, DyTbFeCo, and/or GdTbCo. The multilayer thin film in which the magnetic metal and the nonmagnetic metal are alternately stacked may include, for example, a multilayer thin film such as Co/Pt, Co/Pd, CoCr/Pt, Co/Ru, Co/Os, Co/Au, and/or Ni/Cu. The alloy having the L10 type crystal structure may include, for example, alloys such as $Fe_{50}Pt_{50}$, $Fe_{50}Pd_{50}$, $Co_{50}Pt_{50}$, $Fe_{30}Ni_{20}Pt_{50}$, and/or $Co_{30}Ni_{20}Pt_{50}$. The cobalt-based alloy may include, for example, alloys such as CoCr, CoPt, CoCrPt, CoCrTa, CoCrPtTa, CoCrNb, and/or CoFeB. In some embodiments, the pinned layer 110 may also include a single CoFeB layer.

The free layer 120 may have a variable magnetization direction. For example, the magnetization direction of the free layer 120 may be variable depending on the program current passing through the free layer 120. The free layer 120 may have a perpendicular magnetic anisotropy (PMA). That is, the free layer 120 may have a magnetization easy axis in a direction perpendicular to the extension direction of the free layer 120. A bidirectional arrow B of FIG. 3 indicates that the magnetization direction of the free layer 120 is magnetized parallel to or antiparallel to the magnetization direction of the pinned layer 110. In some embodiments, the magnetization direction of the free layer 120 may vary by a spin transfer torque (STT). The free layer 120 will be described more specifically later with reference to FIGS. 4 and 5.

The tunnel barrier layer 130 may be interposed between the pinned layer 110 and the free layer 120. The tunnel barrier layer 130 may function as an insulated tunnel barrier that generates quantum mechanical tunneling between the pinned layer 110 and the free layer 120.

The tunnel barrier layer 130 may include, for example, but is not limited to, at least one of magnesium oxide (MgO), aluminum oxide ($Al_2O_3$), silicon oxide ($SiO_2$), tantalum oxide ($Ta_2O_5$), silicon nitride (SiN), aluminum nitride (AlN), or combinations thereof. In some embodiments, the tunnel barrier layer 130 may include magnesium oxide having a sodium chloride (NaCl) crystal structure.

In some embodiments, on the basis of the tunnel barrier layer 130, the pinned layer 110 may be connected to the word line WL, and the free layer 120 may be connected to the bit line BL. For example, the pinned layer 110 may be interposed between a bottom electrode BE and the tunnel barrier layer 130, and the free layer 120 may be interposed between the tunnel barrier layer 130 and a top electrode TE. However, the arrangement of the pinned layer 110 and the free layer 120 of FIG. 3 is merely an example, and the present disclosure is not limited thereto. For example, the position of the pinned layer 110 and the free layer 120 may change from each other on the basis of the tunnel barrier layer 130.

The selection element 200 may be configured to selectively control the flow of charge passing through the magnetic tunnel junction 100. For example, the selection element 200 may include at least one of a diode, a PNP bipolar transistor, an NPN bipolar transistor, an NMOS field effect transistor, or a PMOS field effect transistor. In a case where the selection element 200 is made up of a bipolar transistor or a MOS field effect transistor, which is a three terminal element, an additional wiring (for example, a source line) may be connected to the selection element 200.

In some embodiments, the unit memory cell MC may further include the bottom electrode BE interposed between the magnetic tunnel junction 100 and the selection element 200. In some embodiments, the unit memory cell MC may further include the top electrode TE interposed between the magnetic tunnel junction 100 and the bit line BL.

The magnetic tunnel junction 100 may function as a variable resistance element which may be switched to two resistance states by an electric signal applied thereto. For example, when the magnetization direction of the pinned layer 110 and the magnetization direction of the free layer 120 are parallel to each other, the magnetic tunnel junction 100 has a low resistance value, and the low resistance value may represent, and thus store data "0". In contrast, when the magnetization direction of the pinned layer 110 and the magnetization direction of the free layer 120 are antiparallel to each other, the magnetic tunnel junction 100 has a high resistance value, and the high resistance value may represent, and thus store data "1".

Figure 4:
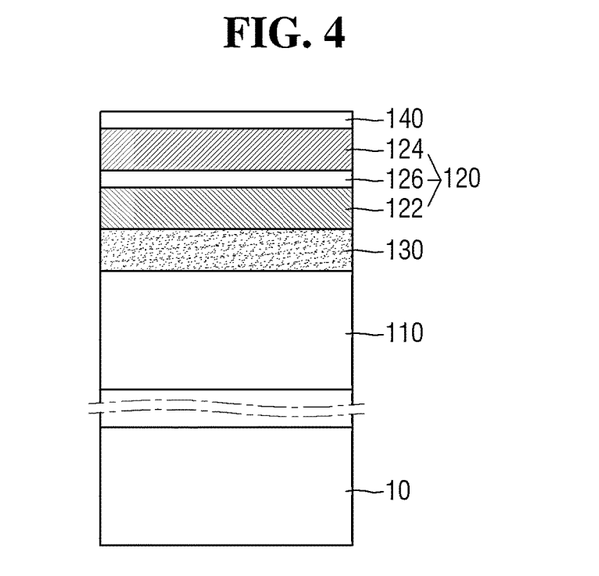
FIG. 4 is a schematic cross-sectional view illustrating the magnetic tunnel junction of the magnetic memory device according to some embodiments of the present inventive concepts.

FIG. 4 is a schematic cross-sectional view illustrating the magnetic tunnel junction of the magnetic memory device according to some embodiments of the present inventive concepts. For the sake of convenience of explanation, like reference numerals are used for like elements, previously described in FIGS. 1 to 3, and a description thereof will be briefly explained or omitted.

Referring to FIG. 4, the magnetic memory device according to some embodiments includes a substrate 10, the pinned layer 110, the free layer 120 and the tunnel barrier layer 130.

The pinned layer 110, the free layer 120 and the tunnel barrier layer 130 may be formed on the substrate 10. The substrate 10 may be, for example, but is not limited to, a silicon substrate, a gallium arsenide substrate, a silicon germanium substrate, a ceramic substrate, a quartz substrate, a display glass substrate, or the like, and may be an SOI (semiconductor on insulator substrate).

In the magnetic memory device according to some embodiments, the free layer 120 may include a first magnetic layer 122 (e.g., first free layer), a second magnetic layer 124 (e.g., second free layer) and a coupling layer 126 forming an exchange coupled composite (ECC).

The first magnetic layer 122 may have perpendicular magnetic anisotropy (PMA). The first magnetic layer 122 may have, for example, first perpendicular magnetic anisotropy energy. The first magnetic layer 122 may have a first magnetization amount. For example, the first magnetic layer 122 may have a first saturation magnetization ($M_s$) of 1200 emu/cc or less. In one embodiment, the first magnetic layer 122 may have the first saturation magnetization of 1200-500 emu/cc. In some embodiments, the first magnetic layer 122 has a TMR (Tunneling Magnetoresistance Ratio) at room temperature (e.g., ~20 to 25 degrees Celsius at an average of 23 degrees Celsius) of greater than 100%. A thickness of the first magnetic layer 122 may be 5 nm or less. For example, a first magnetic layer 122 of CoFeB may by 2 nm thick.

The first magnetic layer 122 may include a Heusler alloy. The first magnetic layer 122 may include, for example, a first Heusler alloy. In some embodiments, the first Heusler alloy has a cubic structure (cubic lattice structure). In some embodiments, the first Heusler alloy has the structure X2YZ, where X=manganese (Mn), iron (Fe), cobalt (Co), nickel (Ni), copper (Cu), ruthenium (Ru), rhodium (Rh), palladium (Pd), silver (Ag), cadmium (Cd), iridium (Jr), platinum (Pt), golf (Au), or magnesium (Mg); Y=beryllium (Be), scandium (Sc), titanium (Ti), vanadium (V), chromium Cr, manganese (Mn), iron (Fe), cobalt (Co), nickel (Ni), zinc (Zn), yttrium (Y), zirconium (Zr), niobium (Nb), molybdenum (Mo), hafnium (Hf), tungsten (W), lanthanum (La), cerium (Ce), praseodymium (Pr), neodymium (Nd), samarium (Sm), gadolinium (Gd), terbium (Tb), dysprosium (Dy), holmium (Ho), erbium (Er), thulium (Tm), ytterbium (Yb), or lutetium (Lu); and Z=magnesium (Mg), boron (B), aluminum (Al), silicon (Si), zinc (Zn), gallium (Ga), germanium (Ge), arsenic (As), indium (In), tin (Sn), antimony (Sb), lead (Pb), or bismuth (Bi).

For example, the first Heusler alloy may include a Co2-based full Heusler alloy. For example, the first Heusler alloy may include at least one of $Co_2MnSi$ or $Co_2FeAl$. Since the Co2-based Heusler alloy has a lower magnetization amount, it is possible to improve the operation speed of the magnetic memory device and there is an advantage of a high TMR ratio.

In an alternative embodiment, the first magnetic layer 122 may be an ordered iron alloy. For example, the first magnetic layer 122 may be FeX, where X is one of Al, Si, Ge, or Ga.

In some embodiments, the first Heusler alloy may have an in-plane magnetic anisotropy (IMA). However, due to the strong perpendicular magnetic anisotropy of the second magnetic layer 124 to be described later, and the magnetic exchange coupling between the first magnetic layer 122 and the second magnetic layer 124, the perpendicular magnetic anisotropy of the first magnetic layer 122 may be secured.

The second magnetic layer 124 may be spaced apart from the tunnel barrier layer 130 with the first magnetic layer 122 therebetween. The second magnetic layer 124 may have stronger perpendicular magnetic anisotropy than the first magnetic layer 122. For example, the second magnetic layer 124 may have a second perpendicular magnetic anisotropy energy greater than the first perpendicular magnetic anisotropy energy.

In some embodiments, the magnetization of the second magnetic layer 124 may be less than the magnetization of the first magnetic layer 122. For example, the second magnetic layer 124 may have a second saturation magnetization less than the first saturation magnetization. For example, the second magnetic layer 124 may have the second saturation magnetization of 500 emu/cc or less. In some embodiments, the second magnetic layer 124 has a thickness of 10 nm or less.

In some embodiments, the second magnetic layer 124 may include a Heusler alloy having perpendicular magnetic anisotropy. For example, the second magnetic layer 124 may include a second Heusler alloy different from the first Heusler alloy. In some embodiments, the second Heusler alloy has a tetragonal structure (tetragonal lattice structure).

The second magnetic layer 124 or second Heusler alloy may include a material having a strong perpendicular magnetic anisotropy. For example, the second magnetic layer 124 or second Heusler alloy may include at least one of cobalt (Co), nickel (Ni), iron (Fe), $Mn_3X$ (where, X is a metal selected from a group including germanium (Ge), gallium (Ga), antimony (Sb) or aluminum (Al)), and combinations thereof. The second Heusler alloy may include, for example, but is not limited to, at least one of $Mn_3Ga$, $Mn_3Ge$, or combinations thereof.

In another embodiment, the second magnetic layer or second Heusler alloy includes a multilayer film such as Co/Pt, Co/Ni, or a rare-earth metal alloy. In another embodiment, the second magnetic layer or second Heusler alloy includes a rare-earth metal.

The coupling layer 126 may be interposed between the first magnetic layer 122 and the second magnetic layer 124. Therefore, the first magnetic layer 122 may be interposed between the tunnel barrier layer 130 and the coupling layer 126. The coupling layer 126 may have a thickness of 1.5 nm or less. The first magnetic layer 122 and the second magnetic layer 124 may form magnetic exchange coupling via the coupling layer 126. In some embodiments, the exchange energy ($J_{ex}$) or magnetic coupling strength of the magnetic exchange coupling may be in the range from 0.05 to 1.0 erg/cm$^2$.

The coupling layer 126 may have a material composition different from the first magnetic layer 122 and the second magnetic layer 124. The coupling layer 126 may include, for example, a metal layer. For example, the coupling layer 126 may include at least one of cobalt (Co), nickel (Ni), iron (Fe), tantalum (Ta), niobium (No), tungsten (W), ruthenium (Ru), or combinations thereof.

In some embodiments, the coupling layer 126 may include a metal oxide layer. The metal oxide layer may include, for example, at least one of magnesium oxide (MgO), magnesium aluminum oxide (MgAlO), hafnium oxide (HfO), tantalum oxide ($Ta_2O_5$), niobium oxide ($Nb_2O_5$), zirconium oxide (ZrO), aluminum oxide (AlO) or combinations thereof.

In some embodiments, the coupling layer 126 may include a material that induces interfacial perpendicular magnetic anisotropy (PMA) at an interface with the first magnetic layer 122. The interface perpendicular magnetic anisotropy refers to a phenomenon in which a magnetic layer internally having in-plane magnetic anisotropy (IMA) is influenced by an interface with another adjacent layer, and has the perpendicular magnetic anisotropy (PMA). For example, when the coupling layer 126 contains a metal oxide, the oxygen atoms of the coupling layer 126 combine with the metal atoms of the first magnetic layer 122, and the interface perpendicular magnetic anisotropy may be induced in the first magnetic layer 122.

In embodiment, the free layer 120 may be formed by forming a first layer of a first material and annealing the first material to form a first magnetic layer 122. Any of the materials discussed above with respect to the first magnetic layer 122 may be used. The free layer is further formed by forming a metal oxide layer (coupling layer 126) on the first magnetic layer 122, forming a second layer of material on the metal oxide, and annealing the second material to form the second magnetic layer 124 on the metal oxide layer 126. Any of the materials discussed above with respect to the metal oxide layer 126 may be used to form the metal oxide, and any of the materials discussed above with respect to the second magnetic layer 124 may be used to form the second magnetic layer 124.

In another embodiment, the free layer 120 may be formed by forming a first layer of a first material, forming a metal oxide layer on the first layer, forming a second layer of a second material on the metal oxide, and annealing the first and second materials to form the first magnetic layer 122 and the second magnetic layer 124, respectively, with the metal oxide layer 126 between the first and second free layers 122 and 124. Again any of the materials discussed above may be used to form these layers.

In some embodiments, on the basis of the tunnel barrier layer 130, the pinned layer 110 may be disposed below the free layer 120. For example, as illustrated, the pinned layer 110, the tunnel barrier layer 130 and the free layer 120 may be stacked on the substrate 10 in that order. In such a case, the first magnetic layer 122, the coupling layer 126 and the second magnetic layer 124 may be stacked on the substrate 10 in that order.

The magnetic memory device according to some embodiments may further include a capping layer 140. The capping layer 140 may be spaced apart from the tunnel barrier layer 130 with the free layer 120 therebetween. For example, as illustrated, when the pinned layer 110 is disposed below the free layer 120 on the basis of the tunnel barrier layer 130, the capping layer 140 may be disposed over the second magnetic layer 124. The capping layer 140 may protect the properties of the free layer 120.

The capping layer 140 may include, for example, a metal layer or a metal oxide layer. The metal layer may include, for example, but is not limited to, at least one of cobalt (Co), nickel (Ni), iron (Fe), tantalum (Ta), tungsten (W), ruthenium (Ru) or combinations thereof. The metal oxide layer may include, for example, but is not limited to, at least one of magnesium oxide (MgO), magnesium aluminum oxide (MgAlO), hafnium oxide (HfO), zirconium oxide (ZrO), aluminum oxide (AlO) or combinations thereof.

Figure 5:
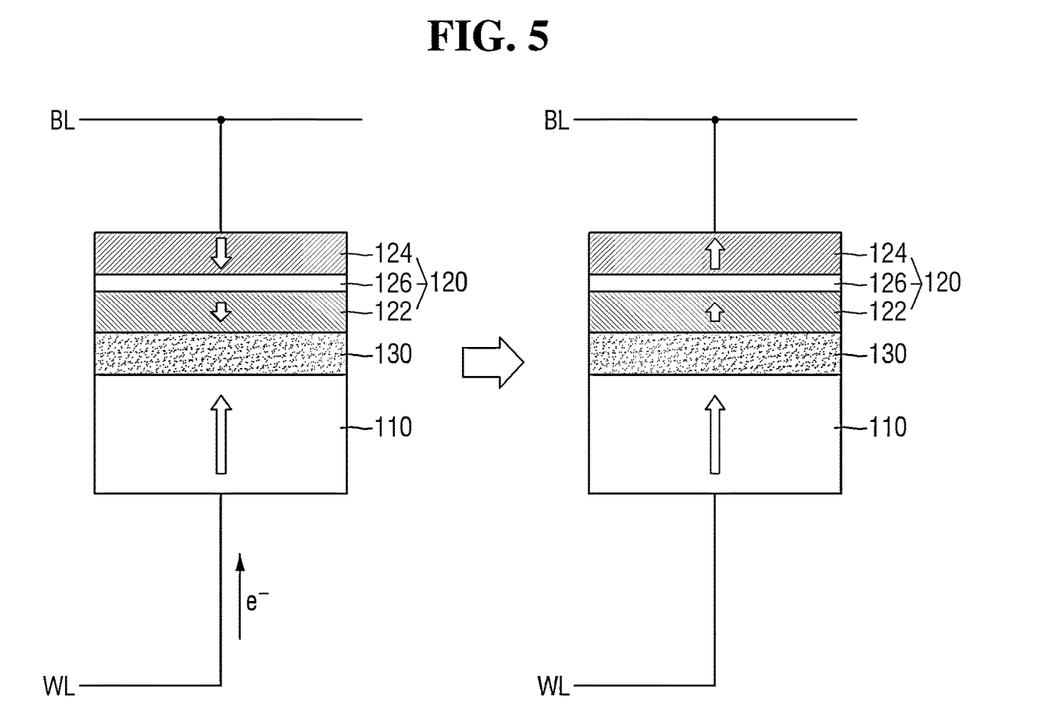
FIG. 5 is a diagram illustrating the magnetic exchange coupling of the magnetic memory device according to some embodiments of the present inventive concepts.

FIG. 5 is a diagram illustrating the magnetic exchange coupling of the magnetic memory device according to some embodiments of the present inventive concepts. For the sake of convenience of explanation, the repeated parts of description provided using FIGS. 1 to 4 will be briefly explained or omitted.

For reference, FIG. 5 illustrates a case where a write current is applied to the magnetic tunnel junction 100 so that the magnetization directions of the free layer 120 and the pinned layer 110 change from the antiparallel state to the parallel state. However, the following description may of course be similarly applied to a case where the write current is applied to the magnetic tunnel junction 100 so that the magnetization directions of the free layer 120 and the pinned layer 110 change from the parallel state to the antiparallel state. Namely, the direction the write current flows controls the change of state from parallel to antiparallel or vice versa.

For example, when the magnetization direction of the free layer 120 is antiparallel to the magnetization direction of the pinned layer 110, electrons (e) may flow in a direction from the pinned layer 110 toward the free layer 120. As a result, the magnetization direction of the free layer 120 may be reversed by the spin transfer torque (STT) induced from the pinned layer 110.

At this time, the spin transfer torque induced from the pinned layer 110 may first reverse the first magnetic layer 122 having a low magnetization amount. Subsequently, due to the magnetic exchange coupling formed by the first magnetic layer 122 and the second magnetic layer 124, the magnetization direction of the second magnetic layer 124 may be reversed until the magnetization direction of the entire free layer 120 is reversed. That is, the second magnetic layer 124 may be easily reversed by magnetic exchange coupling formed by the first magnetic layer 122 and the second magnetic layer 124. Therefore, the operating current applied to the magnetic tunnel junction 100 may be reduced, and a magnetic memory device capable of performing the low-current operation may be provided.

In some embodiments, the exchange energy ($J_{ex}$) of the magnetic exchange coupling may be in the range from 0.05 to 1.0 erg/cm$^2$. When the exchange energy ($J_{ex}$) is less than 0.05 erg/cm$^2$, the magnetic exchange coupling may not be formed between the first magnetic layer 122 and the second magnetic layer 124. When the exchange energy ($J_{ex}$) exceeds 1.0 erg/cm$^2$, the operating current applied to the magnetic tunnel junction 100 may increase.

In the magnetic memory device according to some embodiments, since the free layer 120 is capable of securing sufficient perpendicular magnetic anisotropy, it is possible to provide a magnetic memory device having improved thermal stability. For example, since the free layer 120 includes the second magnetic layer 124 having a strong perpendicular magnetic anisotropy, the sufficient perpendicular magnetic anisotropy may be secured. In the magnetic memory device according to some embodiments, since the free layer 120 includes a coupling layer 126 that induces the interfacial perpendicular magnetic anisotropy (interfacial PMA), the perpendicular magnetic anisotropy may be additionally secured.

In addition, in the magnetic memory device according to some embodiments, since the first magnetic layer 122 includes a Coe-based full Heusler alloy, it is possible to provide a magnetic memory device with a high TMR (Tunneling Magnetoresistance Ratio).

Figure 6:
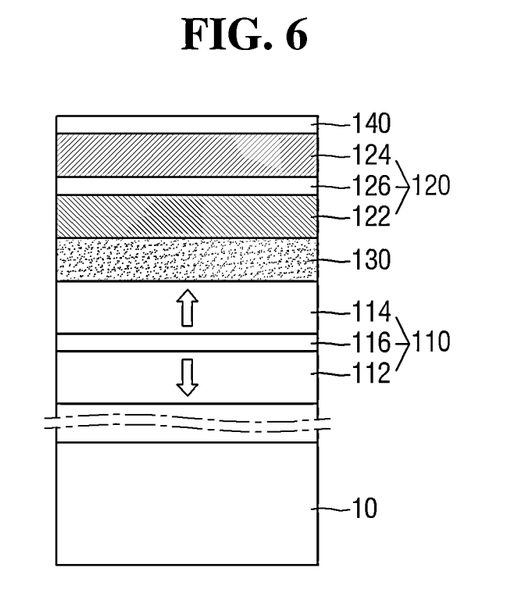
FIG. 6 is a schematic cross-sectional view illustrating the magnetic tunnel junction of the magnetic memory device according to some embodiments of the present inventive concepts.

FIG. 6 is a schematic cross-sectional view illustrating the magnetic tunnel junction of the magnetic memory device according to some embodiments of the present inventive concept. For the sake of convenience of explanation, repeated parts of description provided using FIGS. 1 to 5 will be briefly described or omitted.

Referring to FIG. 6, in the magnetic memory device according to some embodiments, the pinned layer 110 includes a third magnetic layer 112, a fourth magnetic layer 114 and a first nonmagnetic layer 116 forming a synthetic anti-ferromagnetic substance (SAF).

The synthetic anti-ferromagnetic substance (SAF) may exhibit, for example, anti-ferromagnetic coupling (AFC) characteristics due to a RKKY (Ruderman-Kittel-Kasuya-Yosida) interaction. For example, as illustrated, the magnetization direction of the third magnetic layer 112 and the magnetization direction of the fourth magnetic layer 114 are aligned to be antiparallel so that the total magnetization amount of the pinned layer 110 becomes minimum. Since the third magnetic layer 112 and the fourth magnetic layer 114 constitute the pinned layer 110, they may have a pinned magnetization direction.

The third magnetic layer 112 and the fourth magnetic layer 114 may include a ferromagnetic substance. For example, the third magnetic layer 112 and the fourth magnetic layer 114 may include, for example, at least one of amorphous rare earth element alloy, a multilayer thin film in which the magnetic metal (FM) and the nonmagnetic metal (NM) are alternately stacked, an alloy having a L10 type crystal structure, a cobalt-based alloy, or combinations thereof.

The first nonmagnetic layer 116 may be interposed between the third magnetic layer 112 and the fourth magnetic layer 114. The third magnetic layer 112 and the fourth magnetic layer 114 may form antiferromagnetic coupling (AFC) via the first nonmagnetic layer 116. The first nonmagnetic layer 116 may include a nonmagnetic substance. The first nonmagnetic layer 116 may include, for example, at least one of ruthenium (Ru), chromium (Cr), platinum (Pt), palladium (Pd), iridium (Jr), rhodium (Rh), osmium (Os), rhenium (Re), gold (Au), copper (Cu), or combinations thereof.

Figure 7:
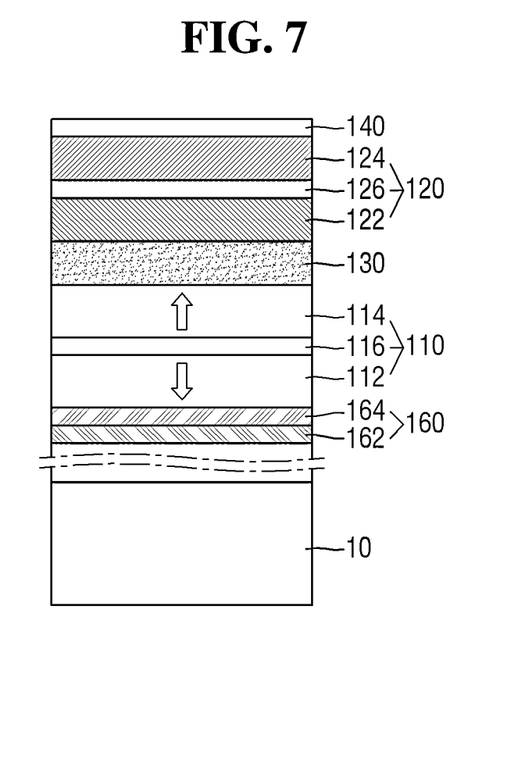
FIG. 7 is a schematic cross-sectional view illustrating the magnetic tunnel junction of the magnetic memory device according to some embodiments of the present inventive concepts.

FIG. 7 is a schematic cross-sectional view illustrating a magnetic tunnel junction in the magnetic memory device according to some embodiments of the present inventive concepts. For the sake of convenience of explanation, the repeated parts of description provided using FIGS. 1 to 6 will be briefly explained or omitted.

Referring to FIG. 7, the magnetic memory device according to some embodiments further includes a seed layer 160.

The seed layer 160 may be disposed below the pinned layer 110 or the free layer 120. The seed layer may be formed by sputtering and annealing. As illustrated, when the pinned layer 110 is disposed below the free layer 120 on the basis of the tunnel barrier layer 130, the seed layer 160 may be disposed below the pinned layer 110. The seed layer 160 strengthens the perpendicular magnetic anisotropy of the pinned layer 110 and may fix the magnetization direction of the pinned layer 110.

The seed layer 160 may include, for example, at least one of tantalum (Ta), ruthenium (Ru), titanium (Ti), palladium (Pd), platinum (Pt), magnesium (Mg), aluminum (Al) or combinations thereof. In some embodiments, the seed layer 160 may be made up of a multilayer thin film in which different nonmagnetic metals are stacked. For example, the seed layer 160 may include a second nonmagnetic layer 162 and a third nonmagnetic layer 164 stacked in order. The second nonmagnetic layer 162 may include, for example, but is not limited to, tantalum (Ta). The third nonmagnetic layer 164 may include, for example, but is not limited to, platinum (Pt).

Figure 8:
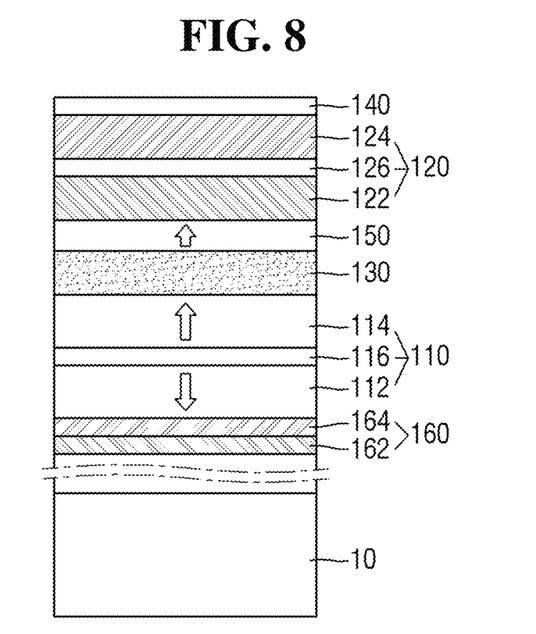
FIG. 8 is a schematic cross-sectional view illustrating the magnetic tunnel junction of the magnetic memory device according to some embodiments of the present inventive concepts.

FIG. 8 is a schematic cross-sectional view illustrating the magnetic tunnel junction of the magnetic memory device according to some embodiments of the present inventive concepts. For the sake of convenience of explanation, repeated parts of description provided using FIGS. 1 to 7 will be briefly described or omitted.

Referring to FIG. 8, the magnetic memory device according to some embodiments further includes a polarization reinforcement layer 150.

The polarization reinforcement layer 150 may be interposed between the tunnel barrier layer 130 and the free layer 120. The polarization reinforcement layer 150 may increase the spin polarization of the free layer 120. In some embodiments, the magnetization direction of the polarization reinforcement layer 150 may be parallel to the magnetization direction of the fourth magnetic layer 114.

The polarization reinforcement layer 150 may include a ferromagnetic substance. The polarization reinforcement layer 150 may include a material with high spin polarizability and low damping constant. For example, the polarization reinforcement layer 150 may include at least one of cobalt (Co), nickel (Ni), iron (Fe), or combinations thereof. In some embodiments, the polarization reinforcement layer 150 may include CoFeB. In some embodiments, the polarization reinforcement layer 150 may further comprise a non-magnetic substance. For example, the polarization reinforcement layer 150 may further include at least one of boron (B), zinc (Zn), ruthenium (Ru), silver (Ag), gold (Au), copper (Cu), carbon (C), nitrogen (N), or combinations thereof.

Figure 9:
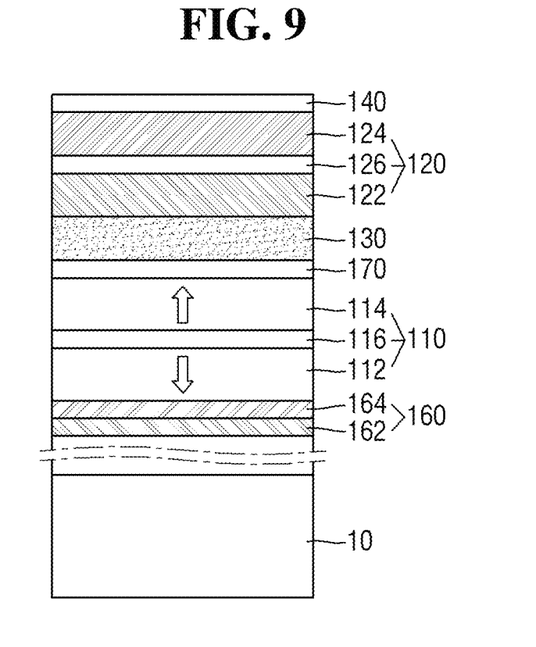
FIG. 9 is a schematic cross-sectional view illustrating the magnetic tunnel junction of the magnetic memory device according to some embodiments of the present inventive concepts.

FIG. 9 is a schematic cross-sectional view illustrating the magnetic tunnel junction of the magnetic memory device according to some embodiments of the present inventive concepts. For the sake of convenience of explanation, repeated parts of description provided using FIGS. 1 to 8 will be briefly described or omitted.

Referring to FIG. 9, the magnetic memory device according to some embodiments further includes an amorphous layer 170.

The amorphous layer 170 may be disposed on the tunnel barrier layer 130. For example, as illustrated, the amorphous layer 170 may be interposed between the tunnel barrier layer 130 and the pinned layer 110.

The amorphous layer 170 may prevent diffusion of elements constituting the pinned layer 110 to protect the properties of the tunnel barrier layer 130. For example, when the fourth magnetic layer 114 includes a crystalline substance of cobalt (Co) or cobalt (Co) alloy, the amorphous layer 170 may include a CoFeB-based amorphous substance to prevent diffusion of the element constituting the fourth magnetic layer 114.

Figure 10:
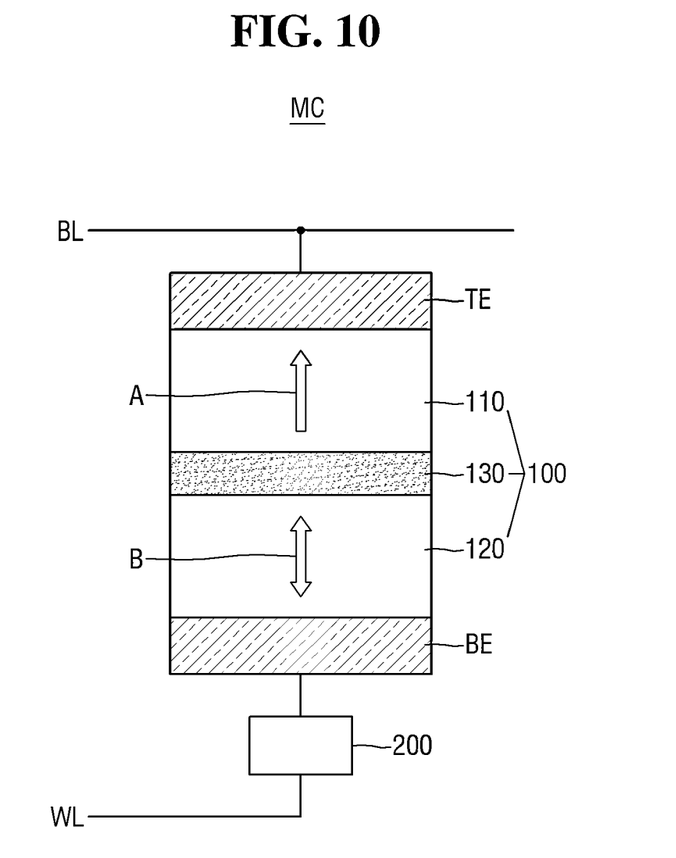
FIG. 10 is a conceptual diagram for explaining a unit memory cell of the magnetic memory device according to some embodiments of the present inventive concepts.
Figure 11:
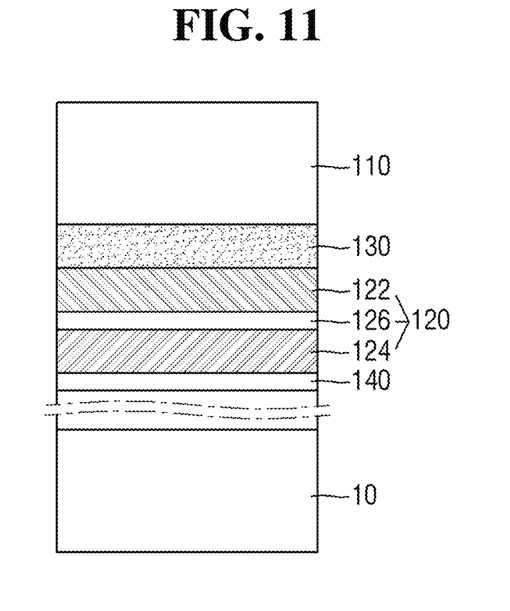
FIG. 11 is a schematic cross-sectional view of the magnetic memory device according to some embodiments of the present inventive concepts.

FIG. 10 is a conceptual diagram for explaining a unit memory cell of the magnetic memory device according to some embodiments of the present inventive concepts. FIG. 11 is a schematic cross-sectional view of the magnetic memory device according to some embodiments of the present inventive concepts. For the sake of convenience of explanation, repeated parts of description provided using FIGS. 1 to 5 will be briefly described or omitted.

Referring to FIG. 10, in the magnetic memory device according to some embodiments, on the basis of the tunnel barrier layer 130, the pinned layer 110 may be connected to the bit line BL, and the free layer 120 may be connected to the word line WL. For example, the pinned layer 110 may be interposed between the top electrode TE and the tunnel barrier layer 130, and the free layer 120 may be interposed between the tunnel barrier layer 130 and the bottom electrode BE.

Referring to FIG. 11, in the magnetic memory device according to some embodiments, the pinned layer 110 may be disposed above the free layer 120 on the basis of the tunnel barrier layer 130. For example, as illustrated, the free layer 120, the tunnel barrier layer 130 and the pinned layer 110 may be stacked on the substrate 10 in that order. In such a case, the second magnetic layer 124, the coupling layer 126, and the first magnetic layer 122 may be stacked on the substrate 10 in this order.

In some embodiments, the capping layer 140 may be spaced apart from the tunnel barrier layer 130 with the free layer 120 interposed therebetween. For example, as illustrated, the capping layer 140 may be interposed between the substrate 10 and the second magnetic layer 124.

Figure 12:
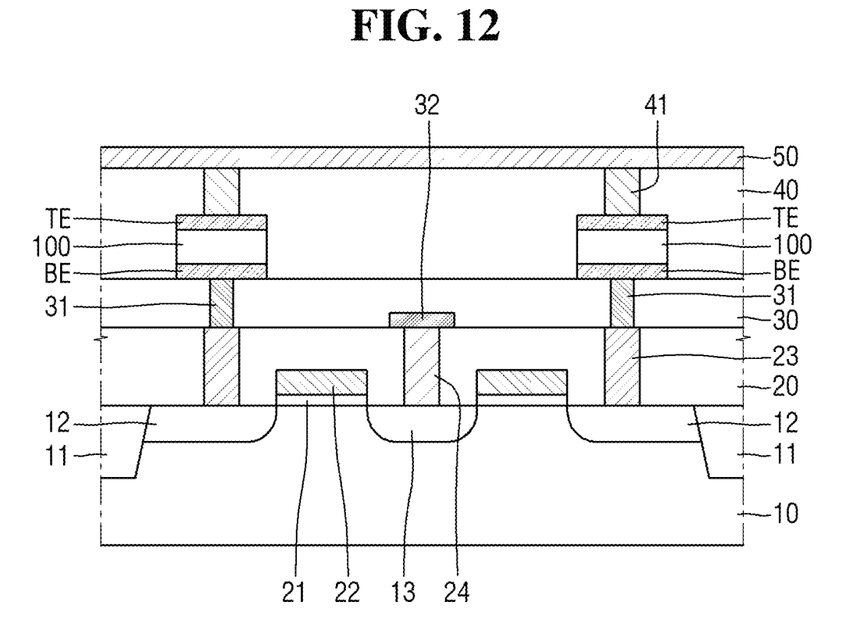
FIG. 12 is a cross-sectional view of the magnetic memory device according to some embodiments of the present inventive concepts.

FIG. 12 is a cross-sectional view of the magnetic memory device according to some embodiments of the present inventive concepts. For the sake of convenience of explanation, repeated parts of description provided using FIGS. 1 to 11 will be briefly described or omitted. For reference, FIG. 12 illustrates a magnetic memory device constituting the STT-MRAM.

Referring to FIG. 12, the magnetic memory device according to some embodiments includes a substrate 10, selection elements 12, 13, 21 and 22, and a magnetic tunnel junction 100. For reference, although the selection elements 12, 13, 21 and 22 are illustrated as MOS field effect transistors, this is merely an example, and the present disclosure is not limited thereto. For example, unlike the illustrated case, a diode or a bipolar transistor may also constitute the selection element.

The substrate 10 may be, for example, but is not limited to, a silicon substrate, a gallium arsenide substrate, a silicon germanium substrate, a ceramic substrate, a quartz substrate, a display glass substrate or the like, and may be an SOI (semiconductor on insulator) substrate.

The selection elements 12, 13, 21 and 22 may include a source region 13, a drain region 12, a gate electrode 22, and a gate insulating film 21. The source region 13 and the drain region 12 may be formed in the substrate 10 to be spaced apart from each other. The gate electrode 22 may be formed on the substrate 10 between the source region 13 and the drain region 12. The gate electrode 22 may extend, for example, across the top surface of the substrate 10 and function as a word line (e.g., WL of FIGS. 2 and 3). The gate electrode 22 may be insulated from the substrate 10 by the gate insulating film 21.

A first interlayer insulating film 20 covering the selection elements 12, 13, 21 and 22 may be formed on the substrate 10. A source line 32 may be formed on a desired (or alternatively, predetermined) region of the first interlayer insulating film 20 corresponding to the source region 13. For example, the source line 32 may be formed to extend in the same direction as the gate electrode 22. In FIG. 12, the adjacent selection elements 12, 13, 21 and 22 are illustrated as sharing the source region 13, but the present disclosure is not limited thereto. For example, the adjacent selection elements 12, 13, 21 and 22 may not share the source region 13 and the drain region 12.

A source line contact 24 and a landing contact 23 may be formed in the first interlayer insulating film 20. The source line contact 24 may electrically connect the source line 32 and the source region 13. The landing contact 23 is formed on the drain region 12 and may be electrically connected to the drain region 12.

A second interlayer insulating film 30 may be formed on the first interlayer insulating film 20. A bottom electrode contact 31 electrically connected to the landing contact 23 may be formed in the second interlayer insulating film 30.

The magnetic tunnel junction 100 according to some embodiments of the present inventive concept may be disposed on the second interlayer insulating film 30. Since the magnetic tunnel junction 100 is the same as that described using FIGS. 1 to 11, the detailed explanation will not be provided below.

The magnetic tunnel junction 100 may be electrically connected to the drain region 12 via, for example, the bottom electrode BE, the bottom electrode contact 31 and the landing contact 23.

A third interlayer insulating film 40 may be formed on the second interlayer insulating film 30. A bit line 50 (e.g., BL of FIGS. 2 and 3) may be formed on the third interlayer insulating film 40. The bit line 50 may extend, for example, to intersect the gate electrode 22. The bit line 50 may be electrically connected to the magnetic tunnel junction 100 via, for example, the top electrode contact 41.

The first interlayer insulating film 20, the second interlayer insulating film 30, and the third interlayer insulating film 40 may include, but is not limited to, an insulating substance, for example, silicon oxide or silicon oxynitride. The landing contact 23, the source line contact 24, the source line 32, the bottom electrode contact 31, the top electrode contact 41, and the bit line 50 may include, for example, but are not limited to, a conductive material, for example, tungsten (W), ruthenium (Ru), tantalum (Ta), copper (Cu), aluminum (Al), doped polysilicon, or the like.

In some embodiments, metal wirings electrically connected to circuits of a peripheral circuit unit (not illustrated) may be further formed on the bit line 50.

With the magnetic tunnel junction of one or more of the example embodiments, and referring to FIGS. 1, the control logic 5 may be configured to control the row decoder 2 and the read/write circuit 4 such that a write current of less than 150 uA is used to write data into a memory cell MC in less than or equal to 10 ns.

In concluding the detailed description, those skilled in the art will appreciate that many variations and modifications may be made to the preferred embodiments without substantially departing from the principles of the present inventive concept. Therefore, the disclosed preferred embodiments of the invention are used in a generic and descriptive sense only and not for purposes of limitation.

What is claimed is:

1. A magnetic memory device, comprising:
   a free layer structure having a variable magnetization direction, the free layer structure including,
      a first free layer, the first free layer including a first Heusler alloy having perpendicular magnetic anisotropy,
      a coupling layer on the first free layer, the coupling layer including a metal oxide layer, and
      a second free layer on the metal oxide layer, the second free layer including a second Heusler alloy comprising a material different from the first Heusler alloy and having perpendicular magnetic anisotropy;
   a pinned layer structure, the pinned layer structure having a fixed magnetization direction; and
   a tunnel barrier layer between the pinned layer structure and the free layer structure,
   wherein the metal oxide layer including at least one of magnesium aluminum oxide (MgAlO), hafnium oxide (HfO), tantalum oxide (Ta2O5), niobium oxide (Nb2O5), zirconium oxide (ZrO), and aluminum oxide (AlO),
   wherein the metal oxide layer induces interfacial perpendicular magnetic anisotropy at an interface with the first free layer.

2. The magnetic memory device of claim 1, wherein the first Heusler alloy having a first perpendicular magnetic anisotropy energy and the second Heusler alloy having a second perpendicular magnetic anisotropy energy greater than the first perpendicular magnetic anisotropy energy.

3. The magnetic memory device of claim 2, wherein the first free layer is interposed between the second free layer and the tunnel barrier layer.

4. The magnetic memory device of claim 1, wherein a magnetic coupling strength between the first free layer and the second free layer is 0.05-1 erg/cm$^2$.

5. The magnetic memory device of claim 1, wherein a thickness of the metal oxide layer is less than or equal to 1.5 nm.

6. The magnetic memory device of claim 1, wherein the first Heusler alloy has a first saturation magnetization, and the second Heusler alloy has a second saturation magnetization being less than the first saturation magnetization.

7. The magnetic memory device of claim 1, wherein the first free layer, the coupling layer and the second free layer form an exchange coupled composite (ECC).

8. The magnetic memory device of claim 1, wherein the first free layer has a cubic structure.

9. The magnetic memory device of claim 1, wherein the first free layer has a saturation magnetization of 1200 emu/cc or less.

10. The magnetic memory device of claim 1, wherein the first free layer has a saturation magnetization of 500-1200 emu/cc.

11. The magnetic memory device of claim 1, wherein the first free layer has a tunneling magnetoresistance ratio at room temperature of greater than 100%.

12. The magnetic memory device of claim 1, wherein the first free layer has thickness of 5 nm or less.

13. The magnetic memory device of claim 1, wherein the second free layer has a tetragonal structure.

14. The magnetic memory device of claim 1, wherein the second free layer has a saturation magnetization of less than or equal to 500 emu/cc.

15. The magnetic memory device of claim 1, wherein the second free layer has a thickness of 10 nm or less.

16. A magnetic memory device, comprising:
   a pinned layer structure, the pinned layer structure having a fixed magnetization direction, the pinned layer structure including,
      a first pinned layer,
      a non-magnetic layer, and
      a second pinned layer, the first pinned layer and the second pinned layer having anti-parallel magnetization directions;
   a free layer structure having a variable magnetization direction, the free layer structure including,
      a first free layer, the first free layer including a first Heusler alloy, and having a first saturation magnetization,
      a metal oxide layer on the first free layer, and a second free layer on the metal oxide layer, the second free layer including a second Heusler alloy having a second saturation magnetization, and the second saturation magnetization being different from the first saturation magnetization; and a tunnel barrier layer between the pinned layer structure and the free layer structure, wherein the metal oxide layer includes at least one of magnesium aluminum oxide (MgAlO), hafnium oxide (HfO), tantalum oxide (Ta2O5), niobium oxide (Nb2O5), zirconium oxide (ZrO), and aluminum oxide (AlO), and wherein the metal oxide layer induces interfacial perpendicular magnetic anisotropy at an interface with the first free layer.

17. The magnetic memory device of claim 16, wherein the first free layer has a cubic structure.

18. The magnetic memory device of claim 16, wherein the second free layer has a tetragonal structure.

19. The magnetic memory device of claim 16, wherein a magnetic coupling strength between the first free layer and the second free layer is 0.05-1 erg/cm$^2$.

* * * * *